(12) United States Patent
Ha et al.

(10) Patent No.: US 7,793,395 B2
(45) Date of Patent: Sep. 14, 2010

(54) METHOD FOR MANUFACTURING A FILM BULK ACOUSTIC RESONATOR

(75) Inventors: Byeoung-ju Ha, Yongin-si (KR); Yun-kwon Park, Dongducheon-si (KR); In-sang Song, Seoul (KR); Il-jong Song, Suwon-si (KR); Jong-seok Kim, Gyeonggi-do (KR); Duck-hwan Kim, Seoul (KR); Jun-sik Hwang, Ohsan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 223 days.

(21) Appl. No.: 11/687,734

(22) Filed: Mar. 19, 2007

(65) Prior Publication Data
US 2007/0157442 A1    Jul. 12, 2007

Related U.S. Application Data

(62) Division of application No. 10/929,569, filed on Aug. 31, 2004, now Pat. No. 7,205,702.

(30) Foreign Application Priority Data

Oct. 8, 2003    (KR) ............................ 2003-69838

(51) Int. Cl.
*H01L 41/22* (2006.01)
*H01L 41/00* (2006.01)
(52) U.S. Cl. .................. 29/25.35; 29/830; 29/831; 29/832; 29/846; 29/835; 310/311
(58) Field of Classification Search ................ 29/25.35, 29/846, 830, 831, 832, 835; 310/320, 311, 310/364, 365, 366, 328; 427/100; 438/52, 438/53
See application file for complete search history.

(56) References Cited

U.S. PATENT DOCUMENTS 4,642,508 A * 2/1987 Suzuki et al. ............... 310/321

(Continued)

FOREIGN PATENT DOCUMENTS

JP          58175314 A    10/1983

(Continued)

OTHER PUBLICATIONS

IEEE Ultrsonics Symposium, Oct. 8-11, 2002, New York (US), D. Profunser et al: "Measurement of the Bulk Acoustic Wave Propagation in Ultra-Thin Membranes", pp. 995-998, XP002246570.

*Primary Examiner*—Derris H Banks
*Assistant Examiner*—Tai Nguyen
(74) *Attorney, Agent, or Firm*—Sughrue Mion, PLLC

(57) ABSTRACT

A film bulk acoustic resonator, and a method for manufacturing the same. The film bulk acoustic resonator includes a substrate, a protection layer vapor-deposited on the substrate, a membrane vapor-deposited on the protection layer and at a predetermined distance from an upper side of the substrate, and a laminated resonance part vapor-deposited on the membrane. Further, the manufacturing method includes vapor-depositing a membrane on a substrate, forming protection layers on both sides of the membrane, vapor-depositing a laminated resonance part on the membrane, and forming an air gap by removing a part of the substrate disposed between the protection layers. Accordingly, the membrane can be formed in a simple structure and without stress, and the whole manufacturing process is simplified.

5 Claims, 4 Drawing Sheets

U.S. PATENT DOCUMENTS

| | | | |
|---|---|---|---|
| 4,870,313 A * | 9/1989 | Hirama et al. | 310/320 |
| 5,160,870 A | 11/1992 | Carson et al. | |
| 5,801,069 A * | 9/1998 | Harada et al. | 438/52 |
| 5,872,493 A * | 2/1999 | Ella | 333/191 |
| 5,938,612 A * | 8/1999 | Kline-Schoder et al. | 600/459 |
| 6,051,907 A * | 4/2000 | Ylilammi | 310/312 |
| 6,305,080 B1 * | 10/2001 | Komuro et al. | 29/890.1 |
| 6,337,477 B1 * | 1/2002 | Shimada et al. | 250/216 |
| 6,561,634 B1 * | 5/2003 | Nishikawa | 347/71 |
| 6,569,754 B2 * | 5/2003 | Wong et al. | 438/612 |
| 6,617,751 B2 * | 9/2003 | Sunwoo et al. | 310/312 |
| 6,662,419 B2 | 12/2003 | Wang et al. | |
| 7,170,668 B2 * | 1/2007 | Yun | 359/291 |
| 7,443,076 B2 * | 10/2008 | Oh et al. | 310/324 |
| 2003/0129785 A1 | 7/2003 | Barber et al. | |
| 2004/0027216 A1 | 2/2004 | Ma et al. | |
| 2004/0104640 A1 | 6/2004 | Wang et al. | |

FOREIGN PATENT DOCUMENTS

| | | |
|---|---|---|
| JP | 62266906 A | 11/1987 |
| JP | 01098311 A | 4/1989 |
| JP | 08148968 A | 6/1996 |
| JP | 09083029 A | 3/1997 |
| JP | 2001-211053 A | 8/2001 |
| KR | 10-2004-0073227 A | 8/2004 |
| WO | WO 99/59244 A2 | 11/1999 |

* cited by examiner

METHOD FOR MANUFACTURING A FILM BULK ACOUSTIC RESONATOR

CROSS-REFERENCE TO RELATED APPLICATIONS

This is a divisional of application Ser. No. 10/929,569 filed Aug. 31, 2004, now U.S. Pat. No. 7,205,702 claiming the benefit of Korean Application No. 2003-69838, filed Oct. 8, 2003, in the Korean Intellectual Property Office; the entire disclosures of the prior applications are incorporated herein by reference in their entirety.

BACKGROUND OF THE INVENTION

1. Field of the Invention

The present invention relates to an acoustic filter used in wireless communication devices, and more particularly, to a film bulk acoustic resonator (hereinafter, referred to as "FBAR") which implements a high pass filter for passing only a specified high frequency component, and a method for manufacturing the same.

2. Description of the Related Art

As mobile communication devices, such as mobile phones have become popular, a small and light filter for such devices has become increasingly in demand. In the meantime, as a means for implementing the small and light filter, an FBAR has been introduced. The FBAR can be produced in bulk at a very low cost, and manufactured in a very small size. In addition, the FBAR enables a high quality factor value which is a special feature of the filter, and can be used in a micro frequency band. In particular, the FBAR is able to realize even a personal communication system (PCS) band and a digital cordless system (DCS) band.

In general, an FBAR element comprises a laminated resonance part created by a first electrode, a piezoelectric layer and a second electrode vapor-deposited in the above order on a substrate. The FBAR is operated as follows. Electric energy is applied to an electrode, and an electric field which temporally changes is induced in the piezoelectric layer. Then, the electric field causes a bulk acoustic wave in the piezoelectric layer in the same direction as a vibration in the laminated resonance part, and generates the resonance.

The FBAR element includes, as shown in FIGS. 1A through 1D, a Bragg reflector-type FBAR and an air gap-type FBAR.

The Bragg reflector-type FBAR of FIG. 1A is formed by vapor-depositing in order of a reflection layer 11, a lower electrode 12, a piezoelectric layer 13, and an upper electrode 14. Here, the reflection layer 11 is formed by vapor-depositing on a substrate 10 materials having a large difference of elastic impedance in an alternate manner. Thus-structured Bragg reflection-type FBAR elements can effectively generate the resonance since all elastic acoustic wave energy passed through the piezoelectric layer 13 is not transferred to the substrate 10, but reflected at the reflection layer 11. The Bragg reflector-type FBAR has a firm structure without a stress from bending, however, it is hard to form the reflection layer of at least 4 layers in precise thickness for total reflection. Additionally, a significant amount of manufacturing time and a large cost are required.

On the other hand, the air gap-type FBAR uses an air gap instead of the reflection layer to separate the substrate from the resonance part, and is divided into several types according to the manufacturing method used. Different types of air gap-type FBAR elements are illustrated in FIGS. 1B through 1D.

The FBAR element in FIG. 1B is a bulk micro-machined FBAR fabricated in a manner that a membrane 21 is formed by $SiO_2$, for example, on the substrate 20, a cavity part 23 is defined by the anisotropic etching of a rear side of the substrate 20, and the acoustic resonator 22 is formed on the membrane 21. An FBAR element thus structured is not practical due to its very weak structure and a low recovery rate.

The FBAR element in FIG. 1C is a surface micro-machined FBAR fabricated as follows. A sacrifice layer (not shown) is formed on the substrate 30, and an insulation membrane 32 is formed on the sacrifice layer and the substrate 30. A first electrode 33, a piezoelectric layer 34 and a second electrode 35 are vapor-deposited in order, and finally, the sacrifice layer is removed to form an air gap 31. More specifically, a via hole (not shown) is formed to connect the exterior of the element to the sacrifice layer inside the element, and an etchant is injected through the via hole to remove the sacrifice layer. Consequently, the air gap 31 is formed. Furthermore, in manufacturing the membrane, the sacrifice layer needs to be slanted, which causes a weak structure due to a high remaining stress of the membrane.

The FBAR element of FIG. 1D is fabricated in the following manner. A cavity part 45 is defined by etching a substrate 40 using a photo-resist membrane, and a sacrifice layer (not shown) is vapor-deposited on the cavity part 45. A membrane 41, a first electrode 42, a piezoelectric layer 43, and a second electrode 44 are vapor-deposited in order on the sacrifice layer and the substrate 40. Then, an air gap 45 is formed by etching the sacrifice layer. In the above manufacturing method, a wet etching and a dry etching are employed in forming the air gap 45. In case of wet etching, it is hard to remove the etchant, moreover, when the etchant is not completely removed, the element becomes weak due to continuous actions of the etchant, and the resonance frequency may be changed. In case of dry etching, on the other hand, the etching is accomplished by a plasmatic gas. At this time, physical impact can be caused by an ion and a molecule, and the membrane 41 or the substrate 40 can be deteriorated by high temperature.

SUMMARY OF THE INVENTION

The present invention has been made to overcome the above-mentioned problems in the related art. Accordingly, it is an aspect of the present invention to provide a film bulk acoustic resonator of an improved degree of integration and a simple structure, wherein an air gap is formed by using a part of a substrate oxidized by LOCOS process for an etching stop layer, and etching a part of the other substrate, and the method for manufacturing the same.

In order to achieve the above-described aspects of the present invention, there is provided a film bulk acoustic resonator comprising a substrate, a protection layer vapor-deposited on the substrate, a membrane vapor-deposited on the protection layer and at a predetermined distance from an upper side of the substrate, and a laminated resonance part vapor-deposited on the membrane.

The protection layer is vapor-deposited on both sides of the substrate except for a predetermined part. The laminated resonance part comprises a lower electrode vapor-deposited on the membrane, a piezoelectric layer vapor-deposited on the lower electrode, and an upper electrode vapor-deposited on the piezoelectric layer.

The membrane may be a single layer of nitride, or multiple layers in which a nitride membrane, an oxidized membrane and the nitride membrane are sequentially vapor-deposited.

Meanwhile, a method for manufacturing a film bulk acoustic resonator according to the present invention, comprises the steps of vapor-depositing a membrane on a substrate, forming protection layers on both sides of the membrane, vapor-depositing a laminated resonance part on the membrane, and forming an air gap by removing a part of the substrate disposed between the protection layers.

Here, the protection layer may be formed by a LOCOS process, and the air gap may be formed by dry etching or wet etching.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE EXEMPLARY EMBODIMENTS

Figure 1A:
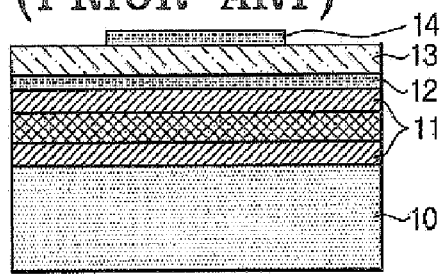
FIGS. 1A to 1D are sectional views of assorted conventional film bulk acoustic resonators (FBAR)
Figure 1B:
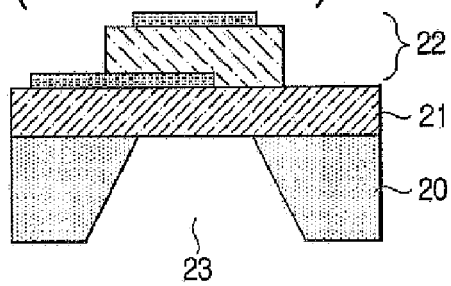
Figure 1C:
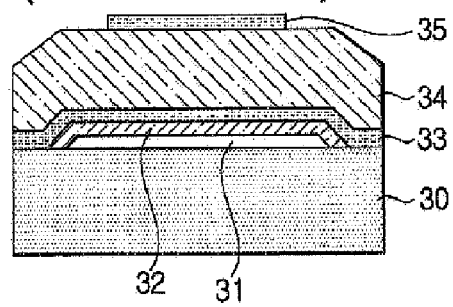
Figure 1D:
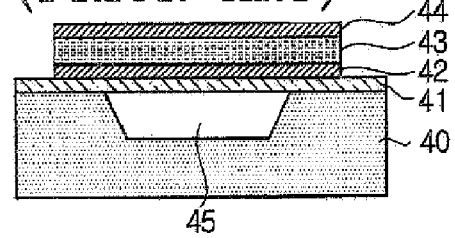
Figure 2:
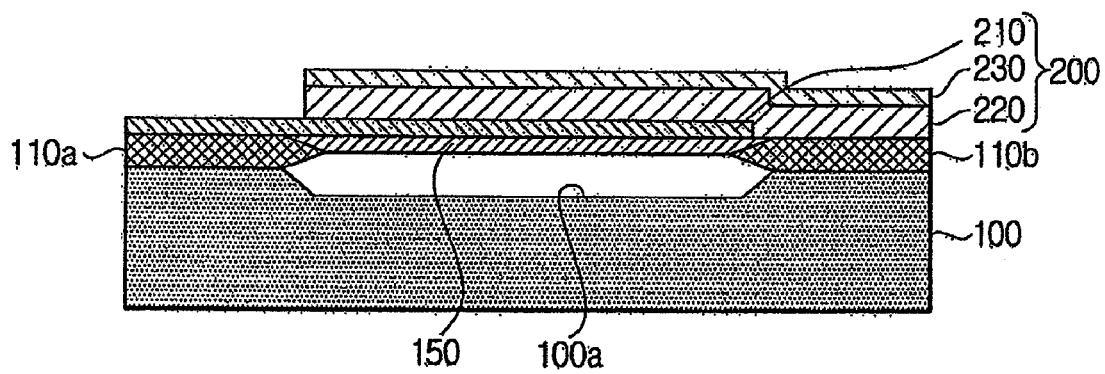
FIG. 2 is a sectional view of an FBAR element according to an embodiment of the present invention.
Figure 2A:
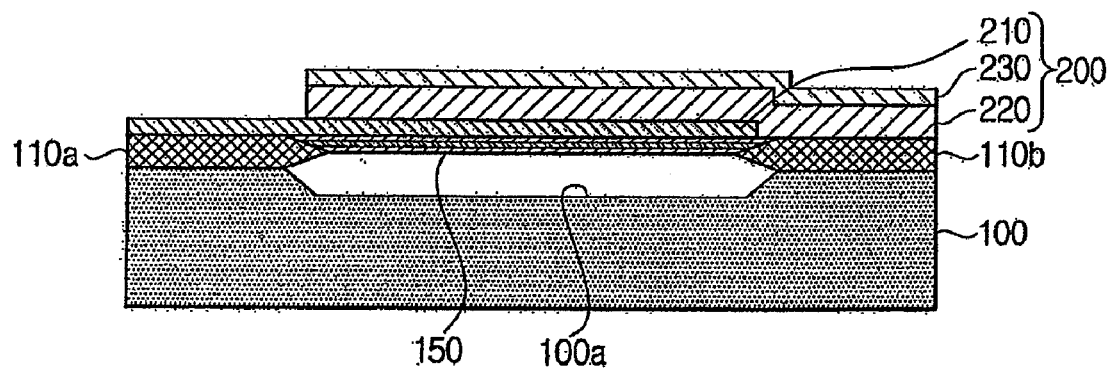
FIG. 2A is a sectional view of an FBAR element according to another embodiment.

As shown in FIG. 2 and FIG. 2A, the FBAR according to the present invention comprises a substrate 100 including an air gap 100a, a membrane 150 vapor-deposited on the air gap 100a to be at a predetermined distance from the substrate 100, and a laminated resonance part 200 vapor-deposited on the membrane 150.

As shown in FIG. 2, the FBAR according to the present invention comprises a substrate 100 including an air gap 100a, a membrane 150 vapor-deposited on the air gap 100a to be at a predetermined distance from the substrate 100, and a laminated resonance part 200 vapor-deposited on the membrane 150.

The membrane 150 is vapor-deposited on an upper part of the air gap 100a between the protection layers 110a and 110b which are on the substrate 100. The membrane 150 supports the laminated resonance part 200, and functions as an oxidation stop layer during the LOCOS process. The membrane 150 may be formed of a single layer of nitride as shown in FIG. 2. Alternatively, the membrane 150 can be formed of a multiple layer in which a nitride membrane, an oxidized membrane and the nitride membrane are sequentially vapor-deposited as shown in FIG. 2A. Therefore, the membrane 150 can be realized in a simple structure and without stress.

The laminated resonance part 200 comprises a lower electrode 210, a piezoelectric layer 220, and an upper electrode 230. The lower electrode 210 is vapor-deposited on the membrane 150 and one protection layer 110a, and the piezoelectric layer 220 is vapor-deposited on the lower electrode 210 and the other protection layer 110b. The upper electrode 230 is vapor-deposited on the piezoelectric layer 220. In this example, the lower and the upper electrodes 210 and 230 use a general electric conductor such as a metal, to apply an electric field to the piezoelectric layer 220. For the lower and the upper electrodes 210 and 230, it is preferable to use one of Al, W, Au, Pt, Ni, Ti, Cr, Pd and Mo. The piezoelectric layer 220 causes a piezoelectric effect when being applied with the electric field, and therefore generates an acoustic wave. For the piezoelectric material, AlN, ZnO, or other material can be used. The acoustic wave generated at the piezoelectric layer 220 is reflected by the air gap 100a, and the resonance effect is enlarged.

The laminated resonance part 200 comprises a lower electrode 210, a piezoelectric layer 220, and an upper electrode 230. The lower electrode 210 is vapor-deposited on the membrane 150 and one of the protection layer 110a, and the piezoelectric layer 220 is vapor-deposited on the lower electrode 210 and the other protection layer 110b. The upper electrode 230 is vapor-deposited on the piezoelectric layer 220. In this example, the lower and the upper electrodes 210 and 230 use a general electric conductor such as a metal, to apply an electric field to the piezoelectric layer 220. For the lower and the upper electrodes 210 and 230, it is preferable to use one of Al, W, Au, Pt, Ni, Ti, Cr, Pd and Mo. The piezoelectric layer 220 causes a piezoelectric effect when being applied with the electric field, and therefore generates an acoustic wave. For the piezoelectric material, AlN, ZnO, or other material can be used. The acoustic wave generated at the piezoelectric layer 220 is reflected by the air gap 100a, and the resonance effect is enlarged.

Figure 3A:
FIGS. 3A to 3G show respective manufacturing processes of the FBAR element according to an embodiment of the present invention.
Figure 3B:
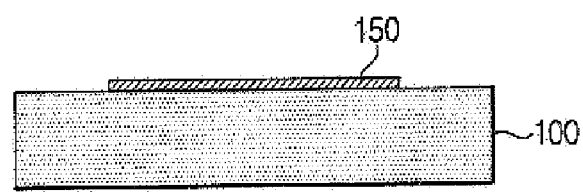
Figure 3C:
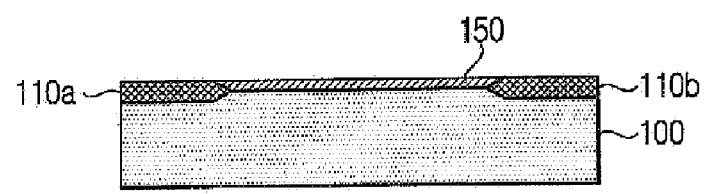

Hereinafter, a method for manufacturing the FBAR element according to an embodiment of the present invention will be described with reference to FIGS. 3A to 3C showing respective processes of manufacturing the FBAR.

FIGS. 3A to 3C show the process of vapor-depositing the membrane 150 and the protection layers 110a and 110b on the substrate 110 using the LOCOS process. Here, the LOCOS process refers to an oxidation process selectively performed with respect to the silicon. In the LOCOS process, two areas are provided on one substrate; one area provided with an oxidation stop layer such as nitride, which can effectively prevent oxygen or vapor from diffusing, and the other area not provided. A thick oxidation membrane is formed on the area wherein the oxidation stop layer is not formed, using a difference in growth rate of thermal oxidization membrane of the two areas. The membrane 150 may be formed with a single layer of the nitride membrane, or with a multiple layer in which a nitride membrane, an oxidized membrane and the nitride membrane are alternately vapor-deposited. As shown in FIG. 3C, when the oxidation process is applied on the substrate 100 having the membrane 150 vapor-deposited, the lower part of the membrane 150 remains as it was, however, the rest of the membrane is oxidized, thereby forming the protection layers 110a and 110b which are the oxidized silicon layers.

Figure 3D:
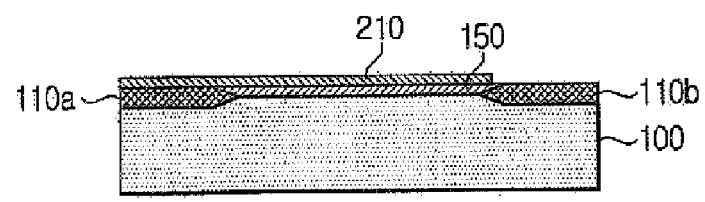
Figure 3E:
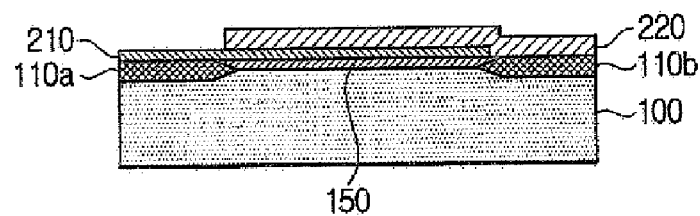
Figure 3F:
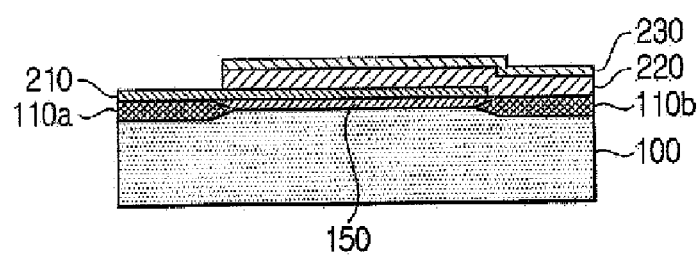

FIGS. 3D to 3G illustrate a self alignment passivation (SAP) process, and especially, FIGS. 3D to 3F show that the piezoelectric layer 200 is vapor-deposited on the membrane 150. FIG. 3D is a process of depositing the lower electrode 210 on the membrane 150 and the one side of the protection layer 110a. The lower electrode 210 is vapor-deposited using a sputtering method, an evaporation method or other methods. FIG. 3E shows that the piezoelectric layer 220 is vapor-deposited on a predetermined part of the lower electrode 210, and the other protection layer 110b. The piezoelectric layer 220 may be deposited using the sputtering or the evaporation method. FIG. 3F shows that the upper electrode 230 is vapor-deposited on the piezoelectric layer 220. The upper electrode 230 may be also vapor-deposited using the sputtering or the evaporation method.

Figure 3G:
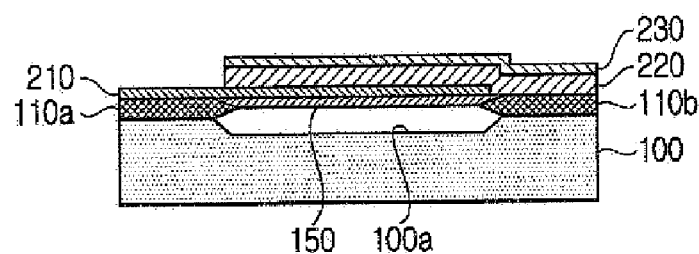

FIG. 3G shows a process of forming the air gap 100a on the substrate 100. After the piezoelectric layer 200 (FIG. 2) is vapor-deposited on the membrane 150, the silicon substrate 100 at a lower part of the membrane 150 is etched to form the air gap 100a. Here, a via hole (not shown) is formed before the etching process. The etching process can be performed using wet etching or dry etching. In case of wet etching, a chemical solvent such as an acetic acid aqueous solution, a hydrofluoric acid, and a phosphoric acid, is injected into the via hole to remove a part of the substrate 100. In case of dry etching, a gas, a plasma, an ion beam, etc., is injected into the via hole to remove a part of the substrate 100, and therefore the air gap 100a is formed.

After the air gap 100a is formed, the FBAR having the structure in FIG. 2 is completed.

Although the present invention has been described above with reference to the FBAR element, it is not for purpose of limitation, and therefore, other various semiconductor elements using a specific layer vapor-deposited on the silicon substrate can be applied.

As described above, according to the present invention, since the element is formed on a surface of the substrate 100, the element occupies a minimum area, and therefore, the element has an improved degree of integration. Furthermore, using the LOCOS process, the membrane 150 can be formed in a simple structure and without stress.

In addition, since a flattening process as in the prior art is omitted, the whole manufacturing process can be simplified. Furthermore, the LOCOS process is compatible with a CMOS process.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method for manufacturing a film bulk acoustic resonator comprising:
   vapor-depositing a membrane on a substrate;
   forming protection layers on the substrate which abut two sides of the membrane;
   vapor-depositing a laminated resonance part on the membrane; and
   forming an air gap by removing a part of the substrate disposed between the protection layers.

2. The manufacturing method of claim 1, wherein the protection layers are formed by a LOCOS process.

3. The manufacturing method of claim 1, wherein the step of vapor-depositing a laminated resonance part comprises:
   vapor-depositing a lower electrode on the membrane;
   vapor-depositing a piezoelectric layer on the lower electrode; and
   vapor-depositing an upper electrode on the piezoelectric layer.

4. The manufacturing method of claim 1, wherein the air gap is formed by dry etching.

5. The manufacturing method of claim 1, wherein the air gap is formed by wet etching.

* * * * *